(12) United States Patent
Millendorf

(10) Patent No.: US 8,560,987 B2
(45) Date of Patent: Oct. 15, 2013

(54) TEST FUNCTIONALITY INTEGRITY VERIFICATION FOR INTEGRATED CIRCUIT DESIGN

(75) Inventor: Steven M. Millendorf, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/484,222

(22) Filed: May 30, 2012

(65) Prior Publication Data

US 2013/0074023 A1 Mar. 21, 2013

Related U.S. Application Data

(60) Provisional application No. 61/537,504, filed on Sep. 21, 2011.

(51) Int. Cl.
G06F 17/50 (2006.01)

(52) U.S. Cl.
USPC .......................................................... 716/106

(58) Field of Classification Search
USPC ................................................. 716/100, 106
See application file for complete search history.

(56) References Cited

U.S. PATENT DOCUMENTS

| | | | |
|---|---|---|---|
| 5,920,490 A * | 7/1999 | Peters ........................... | 716/106 |
| 6,347,388 B1 | 2/2002 | Hollander | |
| 6,393,594 B1 | 5/2002 | Anderson et al. | |
| 6,697,980 B1 | 2/2004 | Glasser | |
| 7,076,753 B2 | 7/2006 | Cerny et al. | |
| 7,103,859 B2 | 9/2006 | Yamada | |
| 2005/0120317 A1 * | 6/2005 | Wei et al. .......................... | 716/4 |
| 2005/0228616 A1 | 10/2005 | Huang et al. | |
| 2007/0288818 A1 * | 12/2007 | Wang ............................. | 714/726 |
| 2010/0097073 A1 * | 4/2010 | Binkley et al. ................ | 324/537 |
| 2010/0333055 A1 | 12/2010 | Yu et al. | |
| 2011/0313580 A1 * | 12/2011 | Bakhmach .................... | 700/292 |
| 2011/0316582 A1 * | 12/2011 | Oda ................................ | 326/33 |
| 2012/0229938 A1 * | 9/2012 | Boll et al. ........................ | 361/42 |

OTHER PUBLICATIONS

Bombieri N. et al., "Hybrid, Incremental Assertion-Based Verification for TLM Design Flows", IEEE Design & Test of Computers, IEEE Service Center, New York, NY, US, vol. 24, No. 2, Mar. 1, 2007, pp. 140-152, XP011185644.

International Search Report and Written Opinion—PCT/US2012/056695—ISA/EPO—Dec. 20, 2012.

Tong, J.G., et al., "Air wolf-TG: A test generator for assertion-based dynamic verification", High Level Design Validation and Test, Workshop, 2009, HLDVT 2009, IEEE International, IEEE, Piscataway, NJ, USA, Nov. 4, 2009, pp. 106-113, XP031570843.

\* cited by examiner

*Primary Examiner* — Suchin Parihar
(74) *Attorney, Agent, or Firm* — Howard Seo

(57) ABSTRACT

Systems and methods are provided for verifying the integrity of test functionality for an integrated circuit design. This may be achieved, for example, by analyzing the integrated circuit design to identify a driver element that outputs a security signal for controlling the test functionality, analyzing the integrated circuit design to identify an input stage of one or more elements that feed the driver element, monitoring the security signal over a range of values for the input stage, and determining that an error exists in the test functionality if a change in the security signal is detected during the monitoring.

44 Claims, 8 Drawing Sheets

TEST FUNCTIONALITY INTEGRITY VERIFICATION FOR INTEGRATED CIRCUIT DESIGN

CLAIM OF PRIORITY UNDER 35 U.S.C. §119

The present application for patent claims priority to Provisional Application No. 61/537,504 entitled "METHOD OF TESTING IMPACT OF SECURITY SIGNALS ON PRODUCTION ENVIRONMENT" filed Sep. 21, 2011, and assigned to the assignee hereof and hereby expressly incorporated by reference herein.

FIELD OF DISCLOSURE

The present disclosure relates generally to integrated circuits, and more specifically, to verifying the integrity of test functionality of an integrated circuit design.

BACKGROUND

Simulation software may be used to verify or functionally test the design of an integrated circuit (IC) before the IC is manufactured. Although simulation software may verify proper operation of the IC design, defects may be introduced into the IC during the manufacturing process, which may cause some portion of the IC to operate differently than designed.

Various test functions are therefore built into many ICs, such as automatic test pattern generation (ATPG), which may help detect such defects. As the name implies, with ATPG, automatically generated test patterns are applied to inputs of various circuit paths of the IC. Defects may be detected by observing logic values at one or more outputs of the circuit while applying a given test pattern. If an IC is free of defects, the values observed at the outputs should match those expected for a given pattern. On the other hand, a defect is considered detected if the value at an output differs from what is expected for a given test pattern. ATPG allows a wide range of patterns to be applied in order to provide an adequate coverage of possible input sequences.

Access to certain test features such as ATPG may be restricted at times to avoid enabling ATPG after initial testing is complete, or for other reasons. Accordingly, in some cases, security signals may be used to control or restrict access to test features such as ATPG. A security signal that controls ATPG must itself be left off of the ATPG testing chain (meaning it is not driven directly by test patterns), or else it will toggle during the course of ATPG testing and disrupt the testing functionality.

However, it may not be sufficient to simply keep the security signal that controls enabling/disabling of ATPG testing off the testing chain. Security signals are typically read from non-volatile storage (e.g., fuses or some other non-volatile technology) and temporarily stored in a register (e.g., a "shadow" register) as the non-volatile memory may not be able to drive the signals directly. Other signals that control, for example, updating of these registers (e.g., a write enable signal) may be subject to modification during an ATPG scan in ways that are not possible during normal system operation. A design error similarly exists if these signals are not immune to modification during the testing procedures because such a modification may cause the security signal to toggle during ATPG testing, disrupting the test and causing it to terminate before completion.

SUMMARY

Exemplary embodiments of the invention are directed to systems and methods for verifying the integrity of test functionality for an integrated circuit design.

In some embodiments, a method is provided for verifying the integrity of test functionality for an integrated circuit design. The method may comprise, for example: analyzing the integrated circuit design to identify a driver element that outputs a security signal for controlling the test functionality; analyzing the integrated circuit design to identify an input stage of one or more elements that feed the driver element; monitoring the security signal over a range of values for the input stage; and determining that an error exists in the test functionality if a change in the security signal is detected during the monitoring.

In other embodiments, an apparatus is provided for verifying the integrity of test functionality for an integrated circuit design. The apparatus may comprise, for example, at least one processor and memory. The at least one processor may be configured to: analyze the integrated circuit design to identify a driver element that outputs a security signal for controlling the test functionality, analyze the integrated circuit design to identify an input stage of one or more elements that feed the driver element, monitor the security signal over a range of values for the input stage, and determine that an error exists in the test functionality if a change in the security signal is detected during the monitoring. The memory may be coupled to the at least one processor and configured to store related data and/or instructions.

In still other embodiments, another apparatus is provided for verifying the integrity of test functionality for an integrated circuit design. The apparatus may comprise, for example: means for analyzing the integrated circuit design to identify a driver element that outputs a security signal for controlling the test functionality; means for analyzing the integrated circuit design to identify an input stage of one or more elements that feed the driver element; means for monitoring the security signal over a range of values for the input stage; and means for determining that an error exists in the test functionality if a change in the security signal is detected during the monitoring.

In still other embodiments, a non-transitory computer-readable medium is provided comprising code, which, when executed by at least one processor, causes the at least one processor to perform operations for verifying the integrity of test functionality for an integrated circuit design. The computer-readable medium may comprise: code for analyzing the integrated circuit design to identify a driver element that outputs a security signal for controlling the test functionality; code for analyzing the integrated circuit design to identify an input stage of one or more elements that feed the driver element; code for monitoring the security signal over a range of values for the input stage; and code for determining that an error exists in the test functionality if a change in the security signal is detected during the monitoring.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Figure 1:
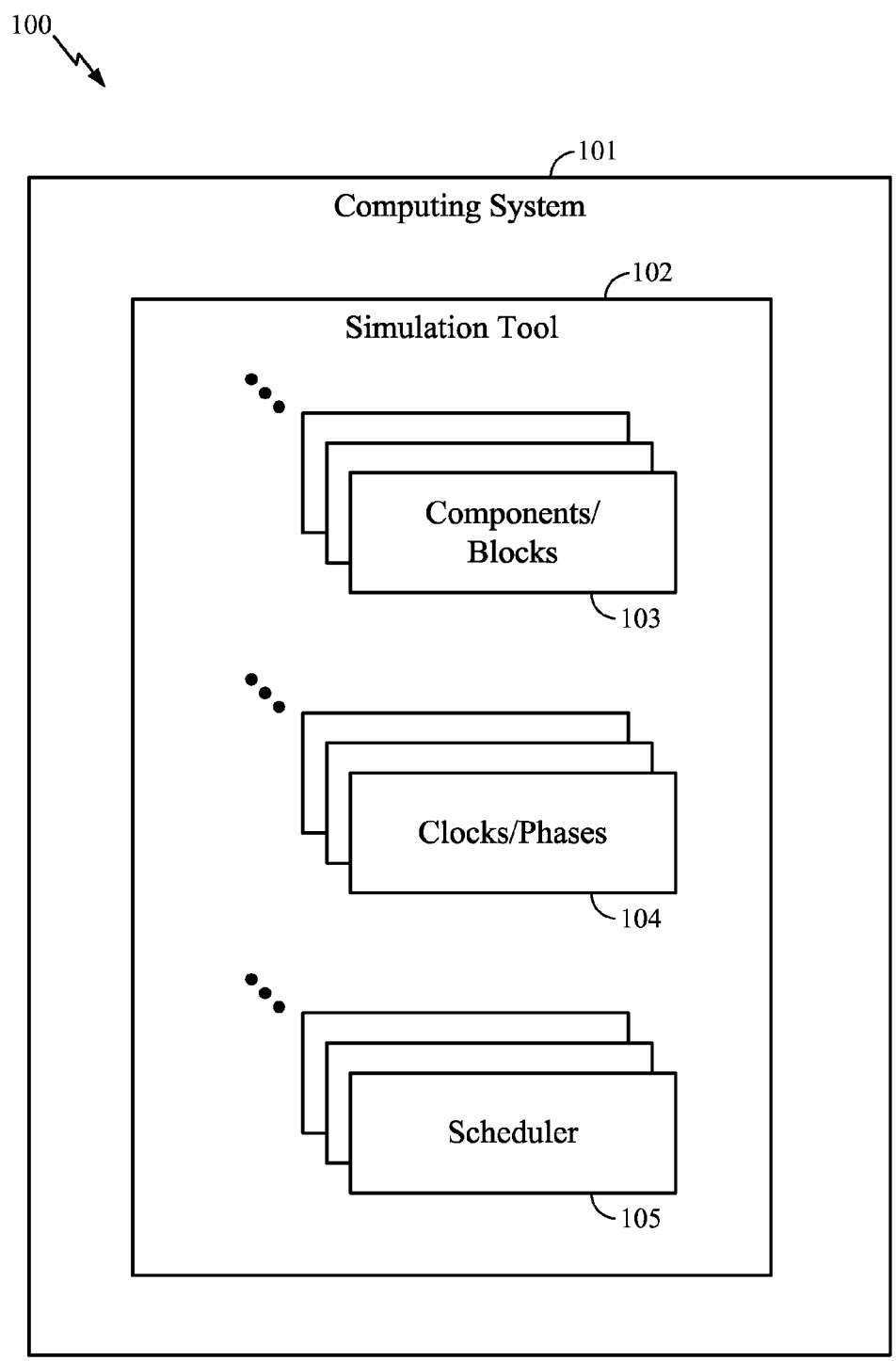
FIG. 1 is a block diagram illustrating an example of a computing system in which a simulation tool may be configured to test the impact of production testing on one or more security signals, in accordance with aspects of the present disclosure.

Aspects of the invention are disclosed in the following description and related drawings directed to specific embodiments of the invention. Alternate embodiments may be devised without departing from the scope of the invention. Additionally, well-known elements of the invention may not be described in detail or may be omitted so as not to obscure more relevant details of the invention.

As previously described, security signals used to restrict access to test features in an IC may be inadvertently toggled during testing, even if these security signals are left off a test chain and the registers driving them are considered as being permanently in "mission mode" (as opposed to scan mode). For example, ATPG may lead to test patterns applied to signals that control the updating of such security signals, rendering the updating of the security signals vulnerable to modification during ATPG in ways that are not possible during normal system operation. Visual inspection of code or a complete run of test vectors (e.g., gate level simulation) to detect such inadvertent toggling may be impractical and prone to error.

Further, verifying whether a design is immune to inadvertent toggling during ATPG is challenging because ATPG scan chain information is typically not available at the register-transfer level (RTL). ATPG scan chain information generally includes the ordering of most register elements in the design into one or more "chains," but ATPG scan chain information is typically added only after translation of RTL to the gate level by automated tools. At this point, it may be too late in the design cycle to do anything about the inadvertent toggling because simulating every test pattern to find the few that may affect the security signals may not be practical with tight time schedules. Such a simulation may take a long period of time (e.g., weeks) because the simulation has to be performed at the gate level. It may also not be practical because of the amount of computing power required to simulate this in a full gate level simulation.

To avoid gate level simulation, embodiments of the present disclosure provide a verification process that operates in RTL to analyze one or more previous stages of elements (e.g., registers) that ultimately control other elements (e.g., also registers) for driving the security signals in question. Unlike conventional functional simulation, values at previous elements may be forced to a series of random patterns. As the purpose of these random patterns is to emulate the set of values that would be present during ATPG, the random patterns may include values that are not normally possible in the system architecture during normal operation.

As will be described in greater detail below, this verification may be performed as an exhaustive test or a search space may be selected that provides adequate assurance of an acceptably low probability of inadvertent toggling. Further, it may be necessary in some cases to go more than one stage back to apply random values to signals one or more stages before a stage that directly controls a driver element for the security signal of interest. Such evaluation may be accommodated by not only tracing a first series of elements that are inputs to the security signals, but also a second series of elements that are inputs to the first series (all the way back to primary inputs if deemed necessary).

FIG. 1 is a block diagram illustrating an example 100 of a computing system 101 in which a simulation tool 102 may be configured to test the impact of production testing on one or more security signals, in accordance with aspects of the present disclosure.

In general, the simulation tool 102 may represent any suitable type of software that simulates the behavior of a digital system or digital components 103. As noted above, simulation tool 102 may be used to verify proper behavior of a circuit before actual fabrication.

The computing system 101 is not limited to a computer system using any specific type of hardware or operating system. For example, the computer system 101 may be a one-board type of computer, such as a controller or a blade server, a common desktop computer, a Windows-based system, a Unix-based system, a Sun Solaris system, a Linux-based system, a distributed system with multiple computing devices, etc. The simulation tool 102 may run on one or more computing systems 101. The simulation tool 102 may include one or more executable programs, libraries, and/or sets of data.

The simulation tool 102 may be used to simulate digital systems and/or digital components. For example, the simulation tool 102 may be used to simulate the digital circuitry in a cellular phone. The simulation tool 102 may represent one or more digital components/blocks 103. Digital components 103 may include certain chips, integrated circuits, transistors, digital building blocks such as logic gates, etc. The simulation tool 102 may represent one or more clock cycles. A represented clock cycle may be referred to as a phase 104. The simulation tool 102 may include one or more schedulers 105. A scheduler 105 may be used to simulate clock phases 104 that are passed to the digital components or blocks 103.

Figure 2:
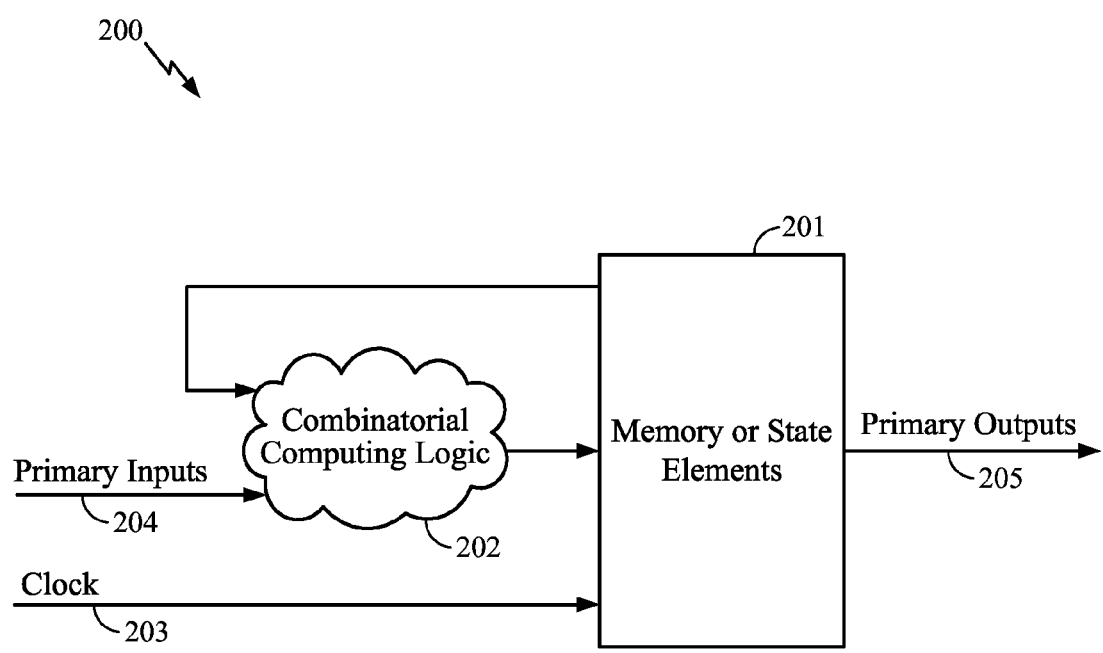
FIG. 2 illustrates example components that may be used in a digital system modeled with a simulation tool, in accordance with aspects of the present disclosure.

FIG. 2 illustrates example components that may be used in a synchronous digital system 200 modeled with a simulation tool 102. Digital system 200 may include memory or state elements 201 and combinatorial logic 202. A clock 203 is also fundamental components of digital system 200.

The digital system 200 may process a series of primary inputs 204 and generate a series of primary outputs 205, one set at a time on one or more edges of the clock 203. Processing usually occurs on both edges, but primary outputs 205 may be generated on only the positive edge, only the negative edge, or on both edges.

Various stages of combinatorial logic 202 may be tested utilizing the techniques presented herein. To verify a design will not exhibit inadvertent toggling of a security signal, patterns of random values may be applied to the one or more signals that control the inputs to the security signal (e.g., a register write enable) while monitoring the security signals for change. For example, elements 201 may represent one or more registers used to drive security signals used to restrict access to test functions. Random patterns may be applied to the primary inputs 204, while monitoring for a change at the primary outputs 205.

In this way, certain aspects of the present disclosure may be used to provide some level of assurance that a security signal will not inadvertently toggle during the course of ATPG testing or the like, which may result in incomplete testing as discussed above. This may be achieved by analyzing a design at a relatively high design level, such as RTL, to verify that a given design is immune to inadvertent toggling during ATPG or similar test functionality. RTL generally involves abstraction in which operation of digital circuits is defined in terms of the flow of signals (or transfer of data) between hardware registers, and the logical operations performed on those signals.

Whether a given circuit design has a low likelihood of exhibiting inadvertent toggling may be verified by analyzing a previous stage of elements (e.g., registers) to each of the inputs to the security signals in question. Unlike traditional RTL simulation, values at each previous register may be toggled with a series of random values, and these values need not be limited to the set of values that are possible in the system architecture. As discussed above, the purpose is to emulate the set of values that may be present during an ATPG scan or other testing procedures, which may differ from those present during normal operation.

According to techniques presented herein, a design may be considered as verified or "passing" if a monitored security signal driven by a register does not toggle regardless of the random patterns applied at one or more input stages directly or indirectly to the register while the simulation is otherwise simulating the design in a test mode.

Figure 3:
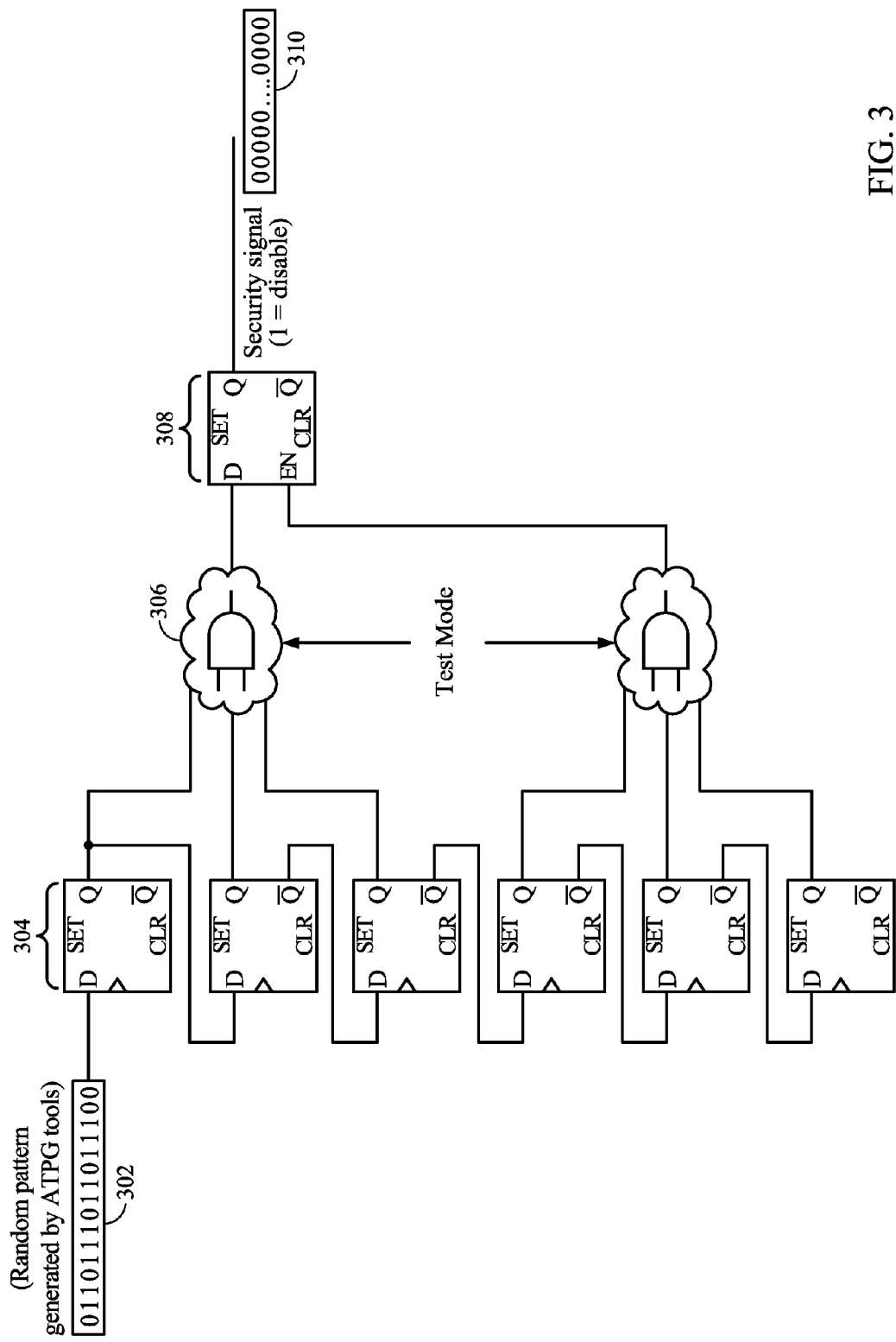
FIG. 3 illustrates an example of a design passing a test, indicating security signals may be immune from updating during automatic test pattern generation (ATPG).

FIG. 3 illustrates an example of a design passing this test, indicating the security signal may be immune from updating during ATPG. Random patterns 302 generated by ATPG tools may be scanned in a first set of registers 304 (e.g., flip-flops). Signals output from the registers 304 may pass through RTL logic 306 before being input into a second set of registers 308. The RTL logic 306 may include any combination of combinatorial logic gates. The output of registers 308 drive the security signals 310. As illustrated, the bits of the security signal 310 remain at zero, preventing ATPG testing from disabling.

Figure 4:
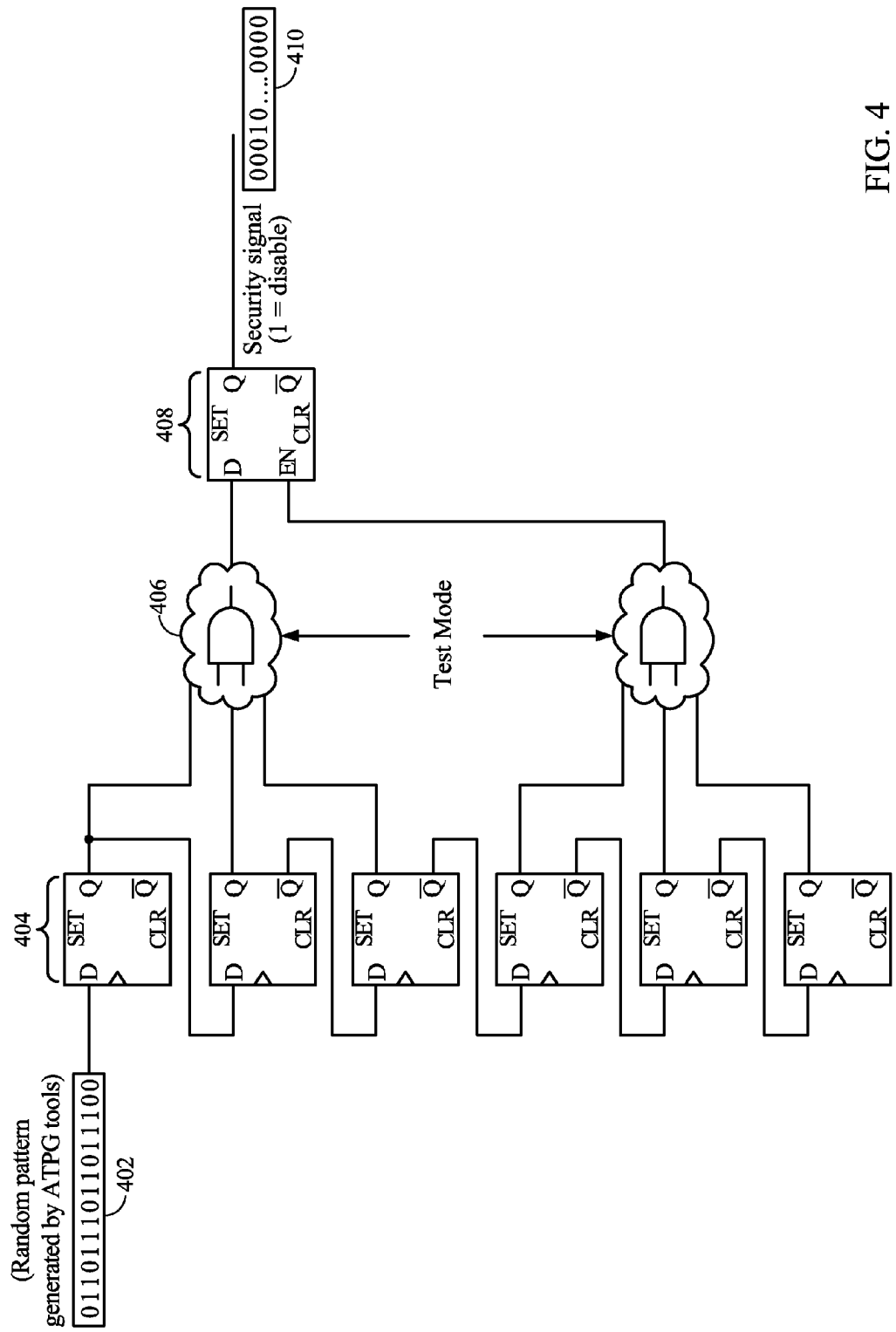
FIG. 4 illustrates an example of a design failing the test, where the security signals toggle, which may disable ATPG testing.

FIG. 4 illustrates an example of a design failing this test, where the security signal toggles, which may disable ATPG testing. In this example, random patterns 402 may be scanned in a first set of registers 404 (e.g., flip-flops). Signals output from the registers 404 may pass through RTL logic 406 before being input into a second set of registers 408. As illustrated, the security signal 410 is inadvertently toggled, as indicated by the fourth bit toggling to a logical 1, which may disable ATPG before completion.

In some embodiments, when verifying a design is immune to inadvertent toggling during ATPG, different or multiple security signals may be considered. In addition to security signals that directly control the enabling/disabling of ATPG, the techniques presented herein may be used to verify whether other types of security signals are immune to inadvertent toggling. As an example, for debug purposes, it may be desirable to re-enable ATPG testing. In some cases, ATPG testing may need to be re-enabled post-manufacturing in order to facilitate failure analysis. However, the scheme used to re-enable ATPG may take a relatively long time to execute.

Therefore, to avoid delays in the event of a reset, a signal may be provided that prevents the signal that enables/disables ATPG from being set to a default value (read from non-volatile memory) that disables ATPG upon reset. Such a signal may also be stored in a register and subject to inadvertent toggling. This may result in allowing the security signal controlling ATPG to, again, be set back to the default value upon reset, requiring the re-enable sequence to be executed again. To avoid this scenario, techniques presented herein may also be used to verify that a design is immune to inadvertently toggling this type of security signal as well.

Returning to FIG. 2, the series of random values may be applied directly or indirectly to the primary inputs 204 of a security signal driving element 201. For example, the series of random values may be put on the registers through FORCE statements, and, for each clock period, may be changed to a different random value, while monitoring the security signal (or signals) in question to ensure there is no change during the course of a test. As above, a test may be considered as passing when no combination of random input values is able to toggle the security signals of interest.

Figure 5:
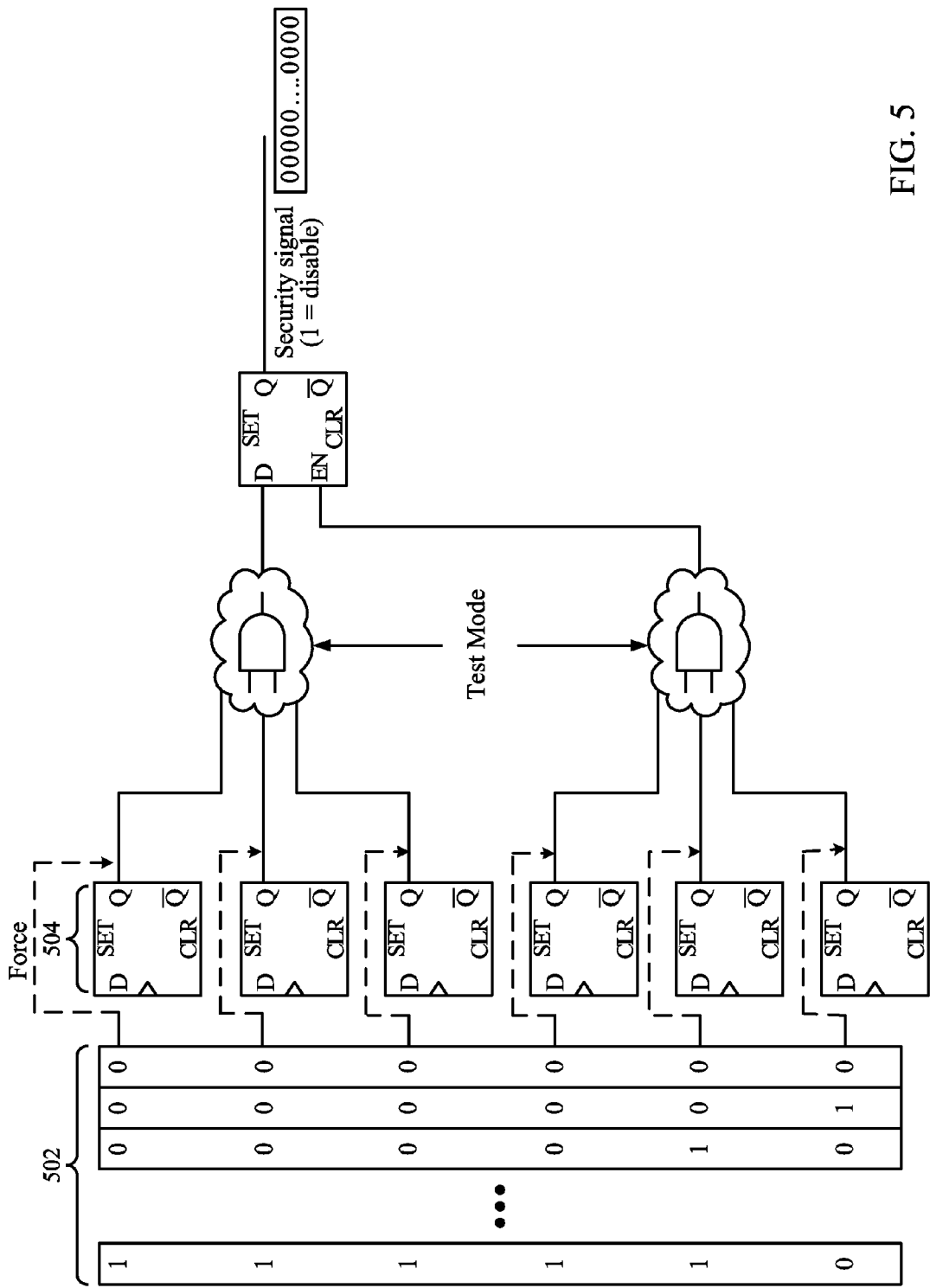
FIG. 5 provides an illustration of a verification process using FORCE statements, in accordance with aspects of the present disclosure.

FIG. 5 provides an illustration of a verification process using FORCE statements in accordance with aspects of the present disclosure. As illustrated, a stage of registers 504 may be toggled with a series of patterns of random values 502.

The series of random values 502 may be applied to outputs of registers 504 through FORCE statements (i.e., the output of each register 504 will be forced to a respective one of the random values 502), and different values may be applied each clock period. Applying the series of random values 502 to outputs of registers 504 through FORCE statements is not the same as "scanning" in the data as might happen in ATPG. Rather, the patterns may be applied during RTL simulation, before ATPG scan logic has been inserted. By forcing values directly on the output of the register 504 using the ability of a simulator to initialize a design to a known value, the simulator may be able to analyze the design in a functionally similar manner as if it were in ATPG test.

In some embodiments, rather than perform an exhaustive search (testing all possible combinations of inputs), a smaller search space that still provides adequate assurance a design will not inadvertently toggle during ATPG may be used. In other words, the test patterns may be selected to ensure an acceptably low probability of inadvertent toggling during ATPG testing. In some cases, the test space may be reduced by analyzing the logic and removing test patterns that are redundant (i.e., functionally similar, resulting in the same output).

Figure 6:
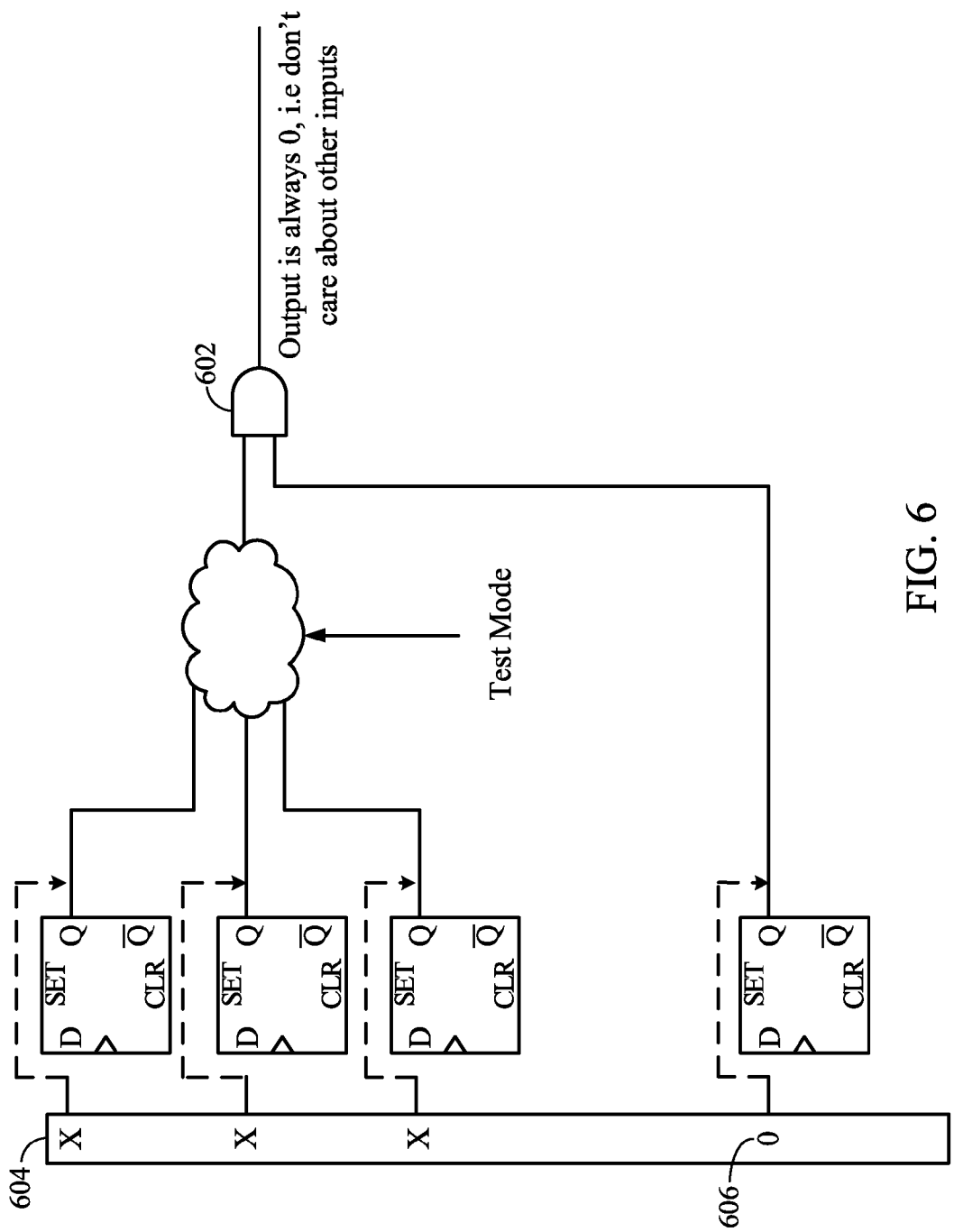
FIG. 6 illustrates a method of minimizing a search space in an exhaustive search, in accordance with aspects of the present disclosure.

FIG. 6 illustrates a method of minimizing a search space in an exhaustive search, in accordance with aspects of the present disclosure. This example assumes that an output from an AND gate 602 has to be set to a 1 in order to cause an inadvertent change to a security signal. In this case, if a particular bit 606 in a vector 604 will cause the AND gate 602 to have an input of 0, then all the other bits in that vector 604 may have no effect (as indicated by "X") and corresponding patterns may be eliminated. Thus, even when an exhaustive search may have proven prohibitive, eliminating redundant patterns may make it possible to perform a similarly effective test.

In other embodiments, rather than perform an exhaustive search, a series of random vectors may be employed with the goal of making it statistically improbable that a failure will occur by using enough vectors. Even in this case, the technique of eliminating redundant vectors may still be employed to further speed analysis.

As described above, visual inspection of the code, or the complete run of the ATPG test vectors in gate level simulation may be impractical. As the logic gets more complicated, proving through paper analysis that ATPG will work can be error prone. Embodiments of the present disclosure provide a simulation method to ensure that ATPG will continue to work in a production environment, with significant cost savings in simulation time by removing the need to run gate level simulations using all of the ATPG patterns.

Figure 7:
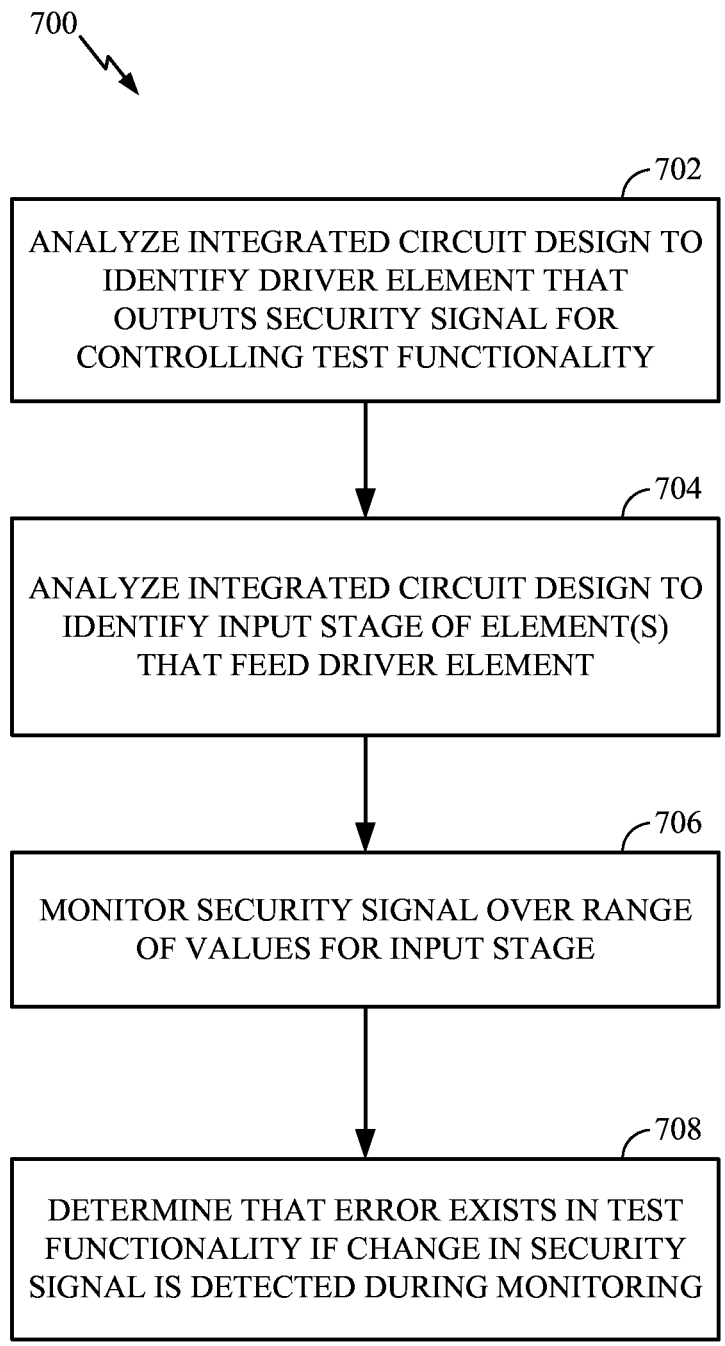
FIG. 7 illustrates an example method for verifying the integrity of test functionality for an integrated circuit design in accordance with aspects of the present disclosure.

FIG. 7 illustrates an example method 700 for verifying the integrity of test functionality for an IC design in accordance with aspects of the present disclosure. The operations 700 may be performed, for example, by a simulator, such as the simulation tool 102 shown in FIG. 1.

The operations begin, at 702, by analyzing the IC design to identify a driver element that outputs a security signal for controlling the test functionality. As discussed above, the security signal may be a first signal that enables and disables ATPG, or a second signal that prevents the first signal from being reset to a default value.

At 704, the IC design is further analyzed to identify an input stage of one or more elements that feed the driver element. As discussed above, the input stage elements may comprise registers directly or indirectly connected to at least one input of the driver element.

At 706, the security signal is monitored over a range of values for the input stage. As discussed above, the values for the input stage may correspond to input values applied to inputs of the input stage elements or output values forced onto outputs of the input stage elements. Further, the values for the input stage may correspond to a randomly selected pattern, and the randomly selected pattern may be changed to another randomly selected pattern for different clock periods. According to various embodiments, the randomly selected patterns for the different clock periods may span an exhaustive range of all combinations of values for the input stage, or a limited range of less than all combinations of values for the input stage.

At 708, any errors existing in the test functionality can be determined if a change in the security signal is detected during the monitoring. A change in the security signal may cause the test functionality to be inadvertently disabled. Detecting an error at this stage of the design process may allow a designer to modify the design and re-run the verification process. According to certain aspects, the pattern(s) that resulted in the change may be stored to aid the designer. Once the verification process is performed with no toggling of the signals of interest, the design may proceed to the next stage.

Figure 8:
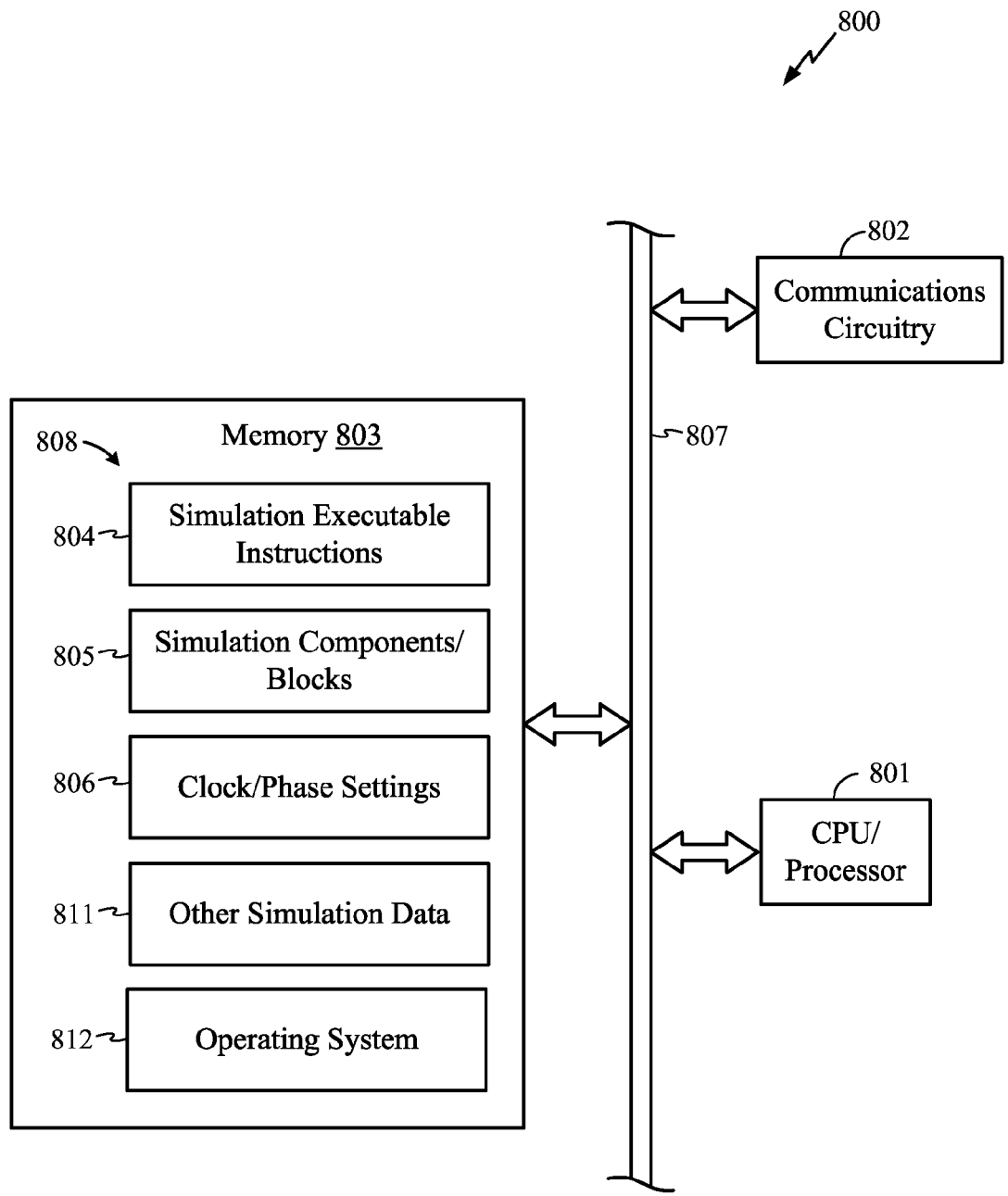
FIG. 8 illustrates part of the hardware that may be used to implement an apparatus for analyzing a previous stage of registers for a plurality of security signals, in accordance with aspects of the present disclosure.

The techniques presented herein for analyzing a design for its possible effect on security signals during production testing may be implemented using any suitable means. As illustrated in FIG. 8, an apparatus 800 may be configured to perform the operations via a set of instructions 804 executed by one or more processors 801.

The apparatus 800 may be any suitable type of computer or work station and may include a central data bus 807 linking several circuits, electronic components or boards together. The circuits/boards/electronic components include a CPU (Central Processing Unit) or a processor 801, a communications circuit 802 (such as a network card), and memory 803.

The communications circuit 802 may be configured for receiving data from and sending data to other apparatuses (e.g., other hardware units) via wired or wireless connections. The CPU/processor 801 performs the function of data management of the data bus 807 and further the function of general data processing, including executing the instructional contents of the memory 803.

The memory 803 includes a set of modules, instructions and/or data generally signified by the reference numeral 808. In this embodiment, the modules/instructions 808 include, among other things, simulation executable instructions 804 for creating and running digital system simulations. The simulation executable instructions 804 include instructions to implement the simulation tool 102 or simulator. Simulation components/blocks 805 are used by the simulation executable instructions 804 to perform digital systems simulations and may include data for modeling hardware components. For example, the simulation components/blocks 805 may analyze a previous stage of registers for a plurality of security signals. The models or blocks model the behavior of the hardware and control clock phases to provide the ability to speed up simulation.

Clock/phase settings 806 are for controlling the various phases used during the digital system simulation. For example, referring back to FIG. 5, the clock/phase settings 806 may toggle the registers 504 with another series of patterns of random values 502. The simulation instructions 804, simulation components/blocks 805, and clock phase settings 806 include computer instructions or code for executing the process steps as shown and described herein.

The memory 803 may include the operating system 812 for the apparatus 800 (e.g., Windows®, Linux®, Unix®, etc.). In addition, other simulation data 811 that may be used by the simulation tool 102 may also be stored in the memory 803.

The memory 803 may be any electronic component capable of storing electronic information. The memory 803 may be embodied as random access memory (RAM), read only memory (ROM), magnetic disk storage media, optical storage media, flash memory devices in RAM, on-board memory included with the processor, EPROM memory, EEPROM memory, an ASIC (Application Specific Integrated Circuit), registers, and so forth, including combinations thereof.

It should further be noted that the inventive processes as described could also be coded as computer-readable instructions carried on any computer-readable medium known in the art. In this specification and the appended claims, the term "computer-readable medium" refers to any medium that may provide instructions to any processor, such as the CPU/processor 801 shown and described in the drawing figure of FIG. 8, for execution. Such a medium can be of the storage type and may take the form of a volatile or non-volatile storage medium as also described previously, for example, in the description of the memory 803 in FIG. 8. The computer-readable medium, described further below, can be part of a computer product separate from the apparatus 803.

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or other programmable logic device, discrete gate or transistor logic, discrete hardware components or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core or any other such configuration.

The steps of a method or algorithm described in connection with the present disclosure may be embodied directly in hardware, in a software module executed by a processor or in a combination of the two. A software module may reside in any form of storage medium that is known in the art. Some examples of storage media that may be used include RAM memory, flash memory, ROM memory, EPROM memory, EEPROM memory, registers, a hard disk, a removable disk, a CD-ROM and so forth. A software module may comprise a single instruction, or many instructions, and may be distributed over several different code segments, among different programs and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the systems, methods, and apparatus described herein without departing from the scope of the claims.

The invention claimed is:

1. A method of verifying the integrity of test functionality for an integrated circuit design, comprising:
employing a processor to execute computer-executable instructions stored on a computer-readable storage medium to implement the following acts:
analyzing the integrated circuit design to identify a driver element that outputs a security signal for controlling the test functionality;
analyzing the integrated circuit design to identify an input stage of one or more elements that feed the driver element;
monitoring the security signal over a range of values for the input stage; and
determining that an error exists in the test functionality if a change in the security signal is detected during the monitoring.

2. The method of claim 1, wherein the change in the security signal causes the test functionality to be disabled.

3. The method of claim 2, wherein the security signal is a first signal that enables and disables automatic test pattern generation (ATPG), or a second signal that prevents the first signal from being reset to a default value.

4. The method of claim 1, wherein the values for the input stage correspond to input values applied to inputs of the input stage elements.

5. The method of claim 1, wherein the values for the input stage correspond to output values forced onto outputs of the input stage elements.

6. The method of claim 1, wherein the values for the input stage correspond to a randomly selected pattern.

7. The method of claim 6, wherein the randomly selected pattern is changed to another randomly selected pattern for different clock periods.

8. The method of claim 7, wherein the randomly selected patterns for the different clock periods span an exhaustive range of all combinations of values for the input stage.

9. The method of claim 7, wherein the randomly selected patterns for the different clock periods span a limited range of less than all combinations of values for the input stage.

10. The method of claim 9, wherein the range of patterns is limited by removal of redundant patterns from combinations of values for the input stage.

11. The method of claim 1, wherein the input stage elements comprise registers directly or indirectly connected to at least one input of the driver element.

12. An apparatus for verifying the integrity of test functionality for an integrated circuit design, comprising:
at least one processor configured to:
analyze the integrated circuit design to identify a driver element that outputs a security signal for controlling the test functionality,
analyze the integrated circuit design to identify an input stage of one or more elements that feed the driver element,
monitor the security signal over a range of values for the input stage, and
determine that an error exists in the test functionality if a change in the security signal is detected during the monitoring; and
memory coupled to the at least one processor and configured to store related data and/or instructions.

13. The apparatus of claim 12, wherein the change in the security signal causes the test functionality to be disabled.

14. The apparatus of claim 13, wherein the security signal is a first signal that enables and disables automatic test pattern generation (ATPG), or a second signal that prevents the first signal from being reset to a default value.

15. The apparatus of claim 12, wherein the values for the input stage correspond to input values applied to inputs of the input stage elements.

16. The apparatus of claim 12, wherein the values for the input stage correspond to output values forced onto outputs of the input stage elements.

17. The apparatus of claim 12, wherein the values for the input stage correspond to a randomly selected pattern.

18. The apparatus of claim 17, wherein the randomly selected pattern is changed to another randomly selected pattern for different clock periods.

19. The apparatus of claim 18, wherein the randomly selected patterns for the different clock periods span an exhaustive range of all combinations of values for the input stage.

20. The apparatus of claim 18, wherein the randomly selected patterns for the different clock periods span a limited range of less than all combinations of values for the input stage.

21. The apparatus of claim 20, wherein the range of patterns is limited by removal of redundant patterns from combinations of values for the input stage.

22. The apparatus of claim 12, wherein the input stage elements comprise registers directly or indirectly connected to at least one input of the driver element.

23. An apparatus for verifying the integrity of test functionality for an integrated circuit design, comprising:
means for analyzing the integrated circuit design to identify a driver element that outputs a security signal for controlling the test functionality;
means for analyzing the integrated circuit design to identify an input stage of one or more elements that feed the driver element;

means for monitoring the security signal over a range of values for the input stage; and means for determining that an error exists in the test functionality if a change in the security signal is detected during the monitoring.

24. The apparatus of claim 23, wherein the change in the security signal causes the test functionality to be disabled.

25. The apparatus of claim 24, wherein the security signal is a first signal that enables and disables automatic test pattern generation (ATPG), or a second signal that prevents the first signal from being reset to a default value.

26. The apparatus of claim 23, wherein the values for the input stage correspond to input values applied to inputs of the input stage elements.

27. The apparatus of claim 23, wherein the values for the input stage correspond to output values forced onto outputs of the input stage elements.

28. The apparatus of claim 23, wherein the values for the input stage correspond to a randomly selected pattern.

29. The apparatus of claim 28, wherein the randomly selected pattern is changed to another randomly selected pattern for different clock periods.

30. The apparatus of claim 29, wherein the randomly selected patterns for the different clock periods span an exhaustive range of all combinations of values for the input stage.

31. The apparatus of claim 29, wherein the randomly selected patterns for the different clock periods span a limited range of less than all combinations of values for the input stage.

32. The apparatus of claim 31, wherein the range of patterns is limited by removal of redundant patterns from combinations of values for the input stage.

33. The apparatus of claim 23, wherein the input stage elements comprise registers directly or indirectly connected to at least one input of the driver element.

34. A non-transitory computer-readable medium comprising code, which, when executed by at least one processor, causes the at least one processor to perform operations for verifying the integrity of test functionality for an integrated circuit design, the computer-readable medium comprising:

code for analyzing the integrated circuit design to identify a driver element that outputs a security signal for controlling the test functionality;

code for analyzing the integrated circuit design to identify an input stage of one or more elements that feed the driver element;

code for monitoring the security signal over a range of values for the input stage; and code for determining that an error exists in the test functionality if a change in the security signal is detected during the monitoring.

35. The computer-readable medium of claim 34, wherein a change in the security signal causes the test functionality to be disabled.

36. The computer-readable medium of claim 35, wherein the security signal is a first signal that enables and disables automatic test pattern generation (ATPG), or a second signal that prevents the first signal from being reset to a default value.

37. The computer-readable medium of claim 34, wherein the values for the input stage correspond to input values applied to inputs of the input stage elements.

38. The computer-readable medium of claim 34, wherein the values for the input stage correspond to output values forced onto outputs of the input stage elements.

39. The computer-readable medium of claim 34, wherein the values for the input stage correspond to a randomly selected pattern.

40. The computer-readable medium of claim 39, wherein the randomly selected pattern is changed to another randomly selected pattern for different clock periods.

41. The computer-readable medium of claim 40, wherein the randomly selected patterns for the different clock periods span an exhaustive range of all combinations of values for the input stage.

42. The computer-readable medium of claim 40, wherein the randomly selected patterns for the different clock periods span a limited range of less than all combinations of values for the input stage.

43. The computer-readable medium of claim 42, wherein the range of patterns is limited by removal of redundant patterns from combinations of values for the input stage.

44. The computer-readable medium of claim 34, wherein the input stage elements comprise registers directly or indirectly connected to at least one input of the driver element.

* * * * *